US008570016B1

(12) United States Patent
Kuo et al.

(10) Patent No.: US 8,570,016 B1
(45) Date of Patent: Oct. 29, 2013

(54) DUTY CYCLE GENERATOR AND POWER CONVERTER

(75) Inventors: Yueh-Lung Kuo, New Taipei (TW); Chih-Yuan Chen, Hsinchu (TW)

(73) Assignee: Anpec Electronics Corporation, Hsinchu Science Park, Hsin-Chu (TW)

( * ) Notice: Subject to any disclaimer, the term of this patent is extended or adjusted under 35 U.S.C. 154(b) by 0 days.

(21) Appl. No.: 13/586,849

(22) Filed: Aug. 15, 2012

(30) Foreign Application Priority Data

Apr. 19, 2012 (TW) .............................. 101113916 A

(51) Int. Cl.
H02M 3/156 (2006.01)
H02M 3/157 (2006.01)
(52) U.S. Cl.
USPC ............................ 323/283; 323/284; 323/288
(58) Field of Classification Search
USPC ................................... 323/282–285, 288, 351
See application file for complete search history.

(56) References Cited

U.S. PATENT DOCUMENTS

| 5,742,151 | A  | * | 4/1998 | Hwang ......................... 323/222 |
| 6,344,980 | B1 | * | 2/2002 | Hwang et al. .............. 363/21.01 |
| 7,558,084 | B2 | * | 7/2009 | Jang ........................... 363/21.12 |
| 7,737,673 | B2 | * | 6/2010 | Xi et al. ........................ 323/285 |
| 2008/0174292 | A1 | * | 7/2008 | Nishida .......................... 323/284 |

* cited by examiner

Primary Examiner — Jessica Han
(74) Attorney, Agent, or Firm — Winston Hsu; Scott Margo

(57) ABSTRACT

A duty cycle generator for generating a duty cycle signal to a power converter is disclosed. The duty cycle generator includes a first inverter, a second inverter, a signal protection unit including an input terminal coupled to the duty cycle signal for generating a break pulse to generate a protected duty cycle signal, a comparator for comparing a triangle-wave signal with a comparison signal to generate a comparison result, a NOR gate for generating a reset signal according to the comparison result and the protected duty cycle signal, an SR-latch for outputting a turn-on signal according to the clock signal and the reset signal, and an AND gate for generating the duty cycle signal according to the inverted clock signal and the turn-on signal.

19 Claims, 6 Drawing Sheets

US 8,570,016 B1

DUTY CYCLE GENERATOR AND POWER CONVERTER

BACKGROUND OF THE INVENTION

1. Field of the Invention

The present invention relates to a duty cycle generator and power converter, and more particularly, to a duty cycle generator and power converter having better noise susceptibility.

2. Description of the Prior Art

An electronic device includes various components, each of which may operate at different voltage levels. Therefore, a direct current (DC) converter is definitely required to adjust (step up or down) and stabilize the voltage level in the electronic device. Originating from a buck (or step down) converter and a boost (or step up) converter, various types of DC converters are accordingly customized to meet different power requirements. As implied by the names, the buck converter is utilized for stepping down a DC voltage of an input terminal to a default voltage level, and the boost converter is for stepping up the DC voltage of the input terminal. With the advancement of modern electronics technology, both of the buck converter and the boost converter are modified and customized to conform to different architectures or to meet different requirements.

For example, please refer to FIG. 1, which is a schematic diagram of a power converter 10. The power converter 10 is used for converting an input voltage $V_{IN}$ to an output voltage $V_{OUT}$, the power converter 10 includes a drive stage circuit 11, an output stage circuit 12, a clock generator 13, a duty cycle generator 14, a feedback circuit 16 and a compensation circuit 18. The drive stage circuit 11 includes a high-side switch HS, a low-side switch LS and front-end drivers 15 and 17, the drive stage circuit 11 may respectively utilize the front-end drivers 15 and 17 to transfer the duty cycle signal $S_{DUTY}$ generated by the duty cycle generator 14 into front-end drive signals UG and LG to respectively turn on or off the high-side switch HS and the low-side switch LS. The high-side switch HS and the low-side switch LS may be switched between turning on and off in turns, i.e. the high-side switch HS is turned on while the low-side switch LS is turned off, and the high-side switch HS is tuned off while the low-side switch LS is turned on, such that an output terminal of the drive stage circuit 11 may generate a switch signal PHASE to the output stage circuit 12. The output stage circuit 12 includes an inductor L and an output capacitor $C_{LOAD}$, the output stage circuit 12 is coupled between the output terminal of the drive stage circuit 11 and a ground. The inductor L of the output stage circuit 12 may be charged and discharged according to the switch signal PHASE outputted by the output drive stage circuit 11, such that the output stage circuit 12 may output voltage $V_{OUT}$ with a predefined voltage value by cooperating with the voltage stabilization function of the output capacitor $C_{LOAD}$.

The feedback circuit 16 includes an adjustment unit AD and a comparator OPA. After the adjustment unit AD transfers the output voltage $V_{OUT}$ into the feedback voltage FB. The comparator OPA may compare the feedback voltage FB with a reference voltage REF to generate a comparison signal COMP to the duty cycle generator 14, such that the duty cycle generator 14 may generate the duty cycle signal $S_{DUTY}$ according to the comparison signal COMP and a clock signal CLK generated by the clock generator 13. The feedback voltage FB is equal to K times the output voltage $V_{OUT}$, wherein K may any constant value. The compensation circuit 18 includes capacitors C1 and C2 and a resistor R, the compensation circuit 18 is used for compensating a frequency response of the power converter 10 to ensure a stable operation of the power converter 10.

Please refer to FIG. 2, which is a schematic diagram of the duty cycle generator 14 shown in FIG. 1. The duty cycle generator 14 includes a comparator 25, inverters IV1, IV2 and IV3, an SR-latch 21 and a triangle-wave generator 22. Connections of the elements in the duty cycle generator 14 are shown in FIG. 2, the clock generator 13 may output the clock signal CLK to the triangle-wave generator to trigger the triangle-wave generator 22 to generate a triangle-wave signal RAMP. When the comparison signal COMP is greater than the triangle-wave signal RAMP, the comparator 25 may output a high voltage. When the comparison signal COMP is less than the triangle-wave signal RAMP, the comparator 25 may output a low voltage. Thus, when the clock signal CLK is at a high voltage, a set input terminal of the SR-latch 21 is at a high voltage, such that the duty cycle signal $S_{DUTY}$ is set to be a high voltage to turn on the high-side switch HS. When the clock signal CLK is at a low voltage and the comparator 25 is at a high voltage, a reset input terminal of the SR-latch 21 is at a high voltage to reset the duty cycle signal $S_{DUTY}$ to be a low voltage to turn off the high-side switch HS. As a result, the duty cycle generator 14 may generate the duty cycle signal $S_{DUTY}$ switching between high and low voltages to control the high-side switch HS and the low-side switch LS to be turned on and off.

An ideal triangle-wave signal RAMP may have a regular triangle-shape, however, the triangle-wave signal RAMP may not have the ideal triangle-shape in practice. A voltage integrator inside the triangle-wave generator 22 is controlled by the clock signal CLK to perform charging and discharging, during an early rising edge of the clock signal CLK, the integrator may occur a transient state response due to an inner parasitic inductor of the triangle-wave generator 22, which may cause ripples or small glitches shown in an early rising edge of the triangle-wave signal RAMP. Please refer to FIG. 3, which is a schematic diagram illustrating waveforms of a non-ideal triangle-wave signal RAMP, the ideal comparison signal COMP, the duty cycle signal $S_{DUTY}$ and the clock signal CLK. As shown FIG. 3, if a voltage level of the comparison signal COMP is relative low, even a small amount of ripple may cause the non-ideal triangle-wave signal RAMP to oscillate around the comparison signal COMP, which may lead to the duty cycle generator 14 generating the wrong duty cycle signal $S_{DUTY}$. In other words, the power converter 10 is easily influenced by the non-ideal triangle-wave signal RAMP to generate the wrong output voltage $V_{OUT}$ when the duty cycle is relative low.

Furthermore, in practice, the power converter 10 may be integrated into a power integrated circuit (IC) through a semiconductor manufacturing process. However, capacitances of the compensation capacitors C1, C2 are usually nano Farads and a resistance of the resistor R is usually mega Ohm, which may not be integrated into the IC due to a limitation of the semiconductor manufacturing process. As a result, the compensation circuit 18 is normally disposed outside the power converter 10. Therefore, the comparison signal COMP is susceptible to noises from outer elements, which may cause the duty cycle signal $S_{DUTY}$ generated by the duty cycle generator 14 to be influenced by the noises leading to the power converter 10 generating the wrong output voltage $V_{OUT}$.

Specifically, please refer to FIG. 4, which is a schematic diagram illustrating waveforms of the ideal triangle-wave signal RAMP, the comparison signal COMP influenced by the noise, the duty cycle signal $S_{DUTY}$ and the clock signal CLK. As shown in FIG. 4, the ideal triangle-wave signal RAMP has a regular triangle-shape, the comparison signal COMP is influenced by the noise (glitch) to have an irregular waveform, the comparison signal COMP influenced by the noise oscillates around the triangle-wave signal RAMP. In other words, since the comparison signal COMP oscillates around the triangle-wave signal RAMP, the comparator 25 output the swinging comparison result OUT, such that the SR-latch 21 outputs the swinging duty cycle signal $S_{DUTY}$ to the power converter 10, which causes the power converter 10 to generate the wrong output voltage $V_{OUT}$ accordingly. Noticeably, if a voltage level of the comparison signal COMP is relatively low, even a small amount of noise might cause the duty cycle generator 14 to generate the wrong duty cycle signal $S_{DUTY}$. In short, the power converter 10 may be easily influenced by the noise to generate the wrong output voltage $V_{OUT}$ when the duty cycle is relative low.

Therefore, in order to solve the situation that the power converter 10 operating in a low duty may generate the wrong output voltage $V_{OUT}$ due to a non-ideal response or noises from the outer elements, there is a need to improve the prior art.

SUMMARY OF THE INVENTION

It is therefore an object of the present invention to provide a duty cycle generator and power converter having better noise resistance.

The present invention discloses a duty cycle generator for generating a duty cycle signal to a power converter, comprising a first inverter coupled to a clock signal for inverting the clock signal, a second inverter cascaded to the first inverter for outputting the clock signal, a signal protection unit including an input terminal coupled to the duty cycle signal for generating a break pulse to generate a protected duty cycle signal, a comparator including a positive input terminal coupled to a comparison signal of the power converter and a negative input terminal coupled to a triangle-wave signal for comparing the triangle-wave signal with the comparison signal to generate a comparison result, a NOR gate including a first input terminal coupled to the comparison result, and a second input terminal coupled to an output terminal of the signal protection unit for generating a reset signal according to the comparison result and the protected duty cycle signal, an SR-latch including a set input terminal coupled to an output terminal of the second inverter, a reset input terminal coupled to an output terminal of the NOR gate, and an output terminal for outputting a turn-on signal according to the clock signal and the reset signal, and an AND gate including a first input terminal coupled to the output terminal of the SR-latch, and a second input terminal coupled to the output terminal of the first inverter and the input terminal of the second inverter for generating the duty cycle signal according to the inverted clock signal and the turn-on signal.

The present invention further discloses a power converter for converting an input voltage to an output voltage, comprising a duty cycle generator for generating a duty cycle signal, comprising a first inverter coupled to a clock signal for inverting the clock signal, a second inverter cascaded to the first inverter for outputting the clock signal, a signal protection unit including an input terminal coupled to the duty cycle signal for generating a break pulse to generate a protected duty cycle signal, a comparator including a positive input terminal coupled to a comparison signal of the power converter and a negative input terminal coupled to a triangle-wave signal for comparing the triangle-wave signal with the comparison signal to generate a comparison result, a NOR gate including a first input terminal coupled to the comparison result, and a second input terminal coupled to an output terminal of the signal protection unit for generating a reset signal according to the comparison result and the protected duty cycle signal, an SR-latch including a set input terminal coupled to an output terminal of the second inverter, a reset input terminal coupled to an output terminal of the NOR gate, and an output terminal for outputting a turn-on signal according to the clock signal and the reset signal, and an AND gate including a first input terminal coupled to the output terminal of the SR-latch, and a second input terminal coupled to the output terminal of the first inverter and the input terminal of the second inverter for generating the duty cycle signal according to the inverted clock signal and the turn-on signal, a drive stage circuit coupled to an output terminal of the duty cycle generator for outputting a switch signal according to the duty cycle signal, an output stage circuit coupled to an output terminal of the drive stage circuit for generating the output voltage according to the switch signal, and a feedback circuit coupled between the output stage circuit and the duty cycle generator for outputting the comparison signal to the duty cycle generator according to the output voltage.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
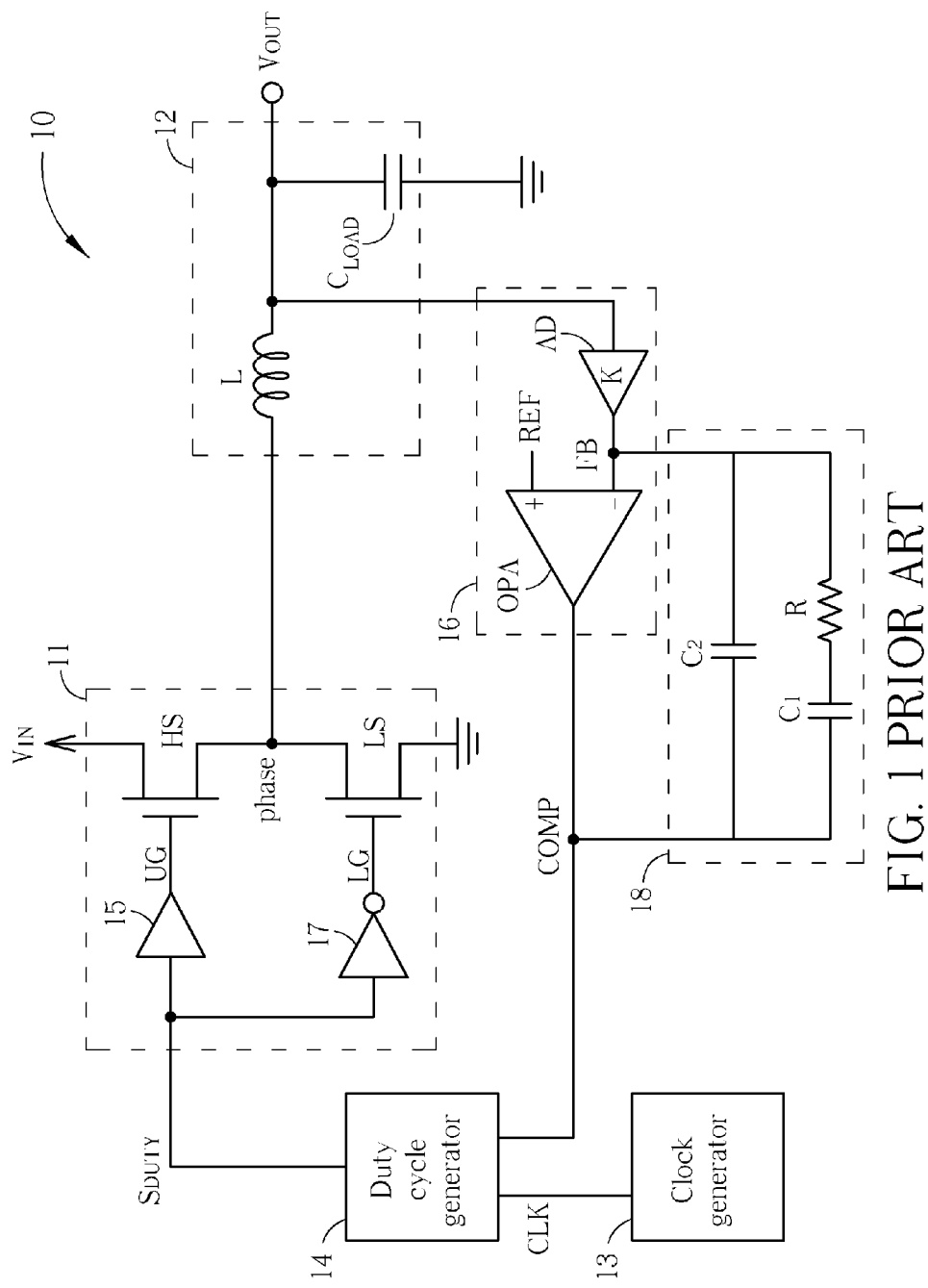
FIG. 1 is a schematic diagram of a traditional power converter.
Figure 2:
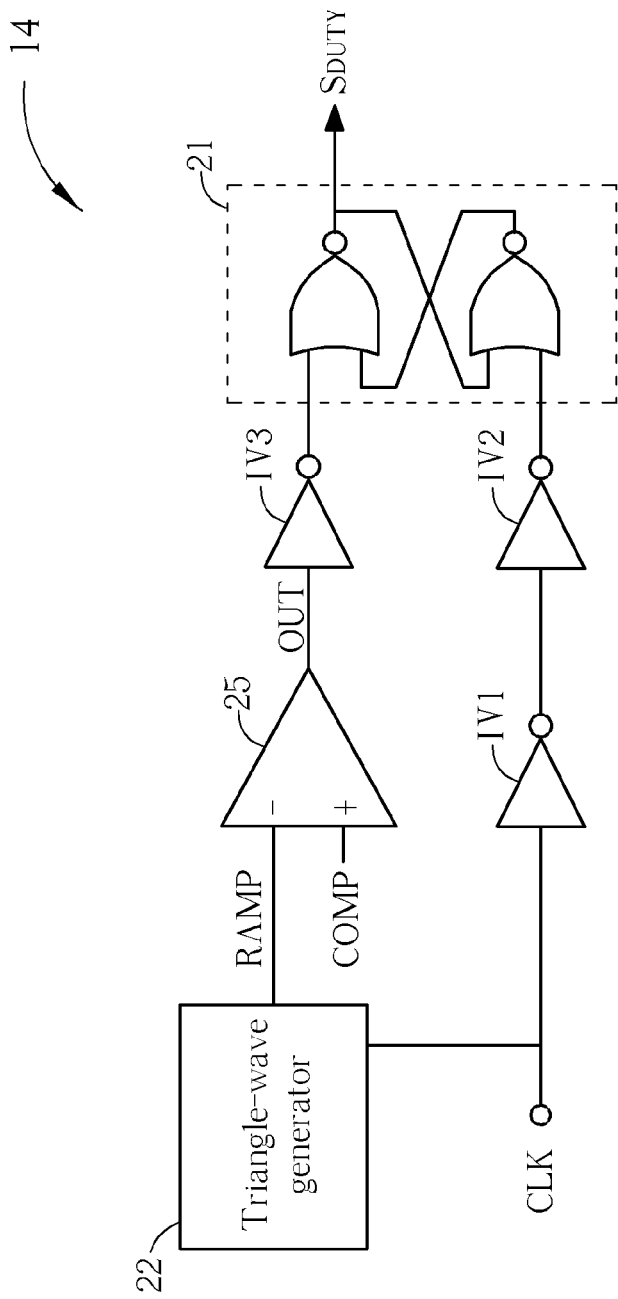
FIG. 2 is a schematic diagram of the duty cycle generator shown in FIG. 1.
Figure 3:
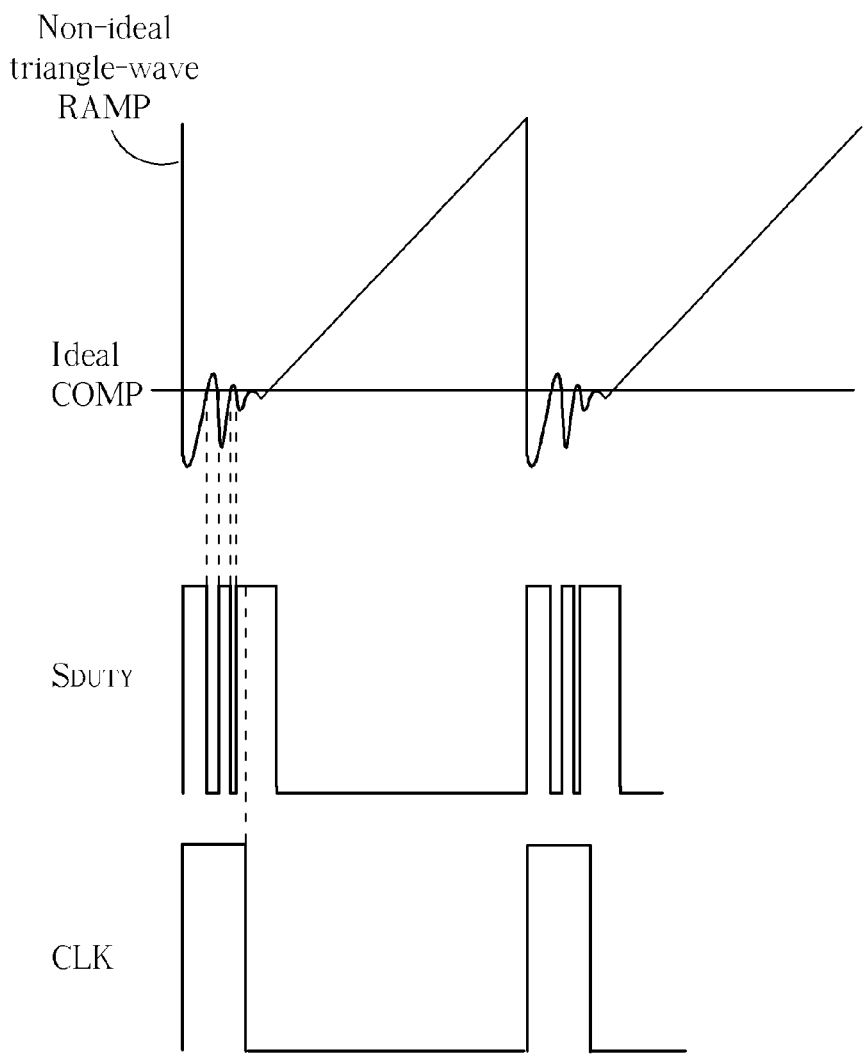
FIG. 3 is a schematic diagram of waveforms of a non-ideal triangle-wave signal, an ideal comparison signal, the duty cycle signal and the clock signal shown in FIG. 2.
Figure 4:
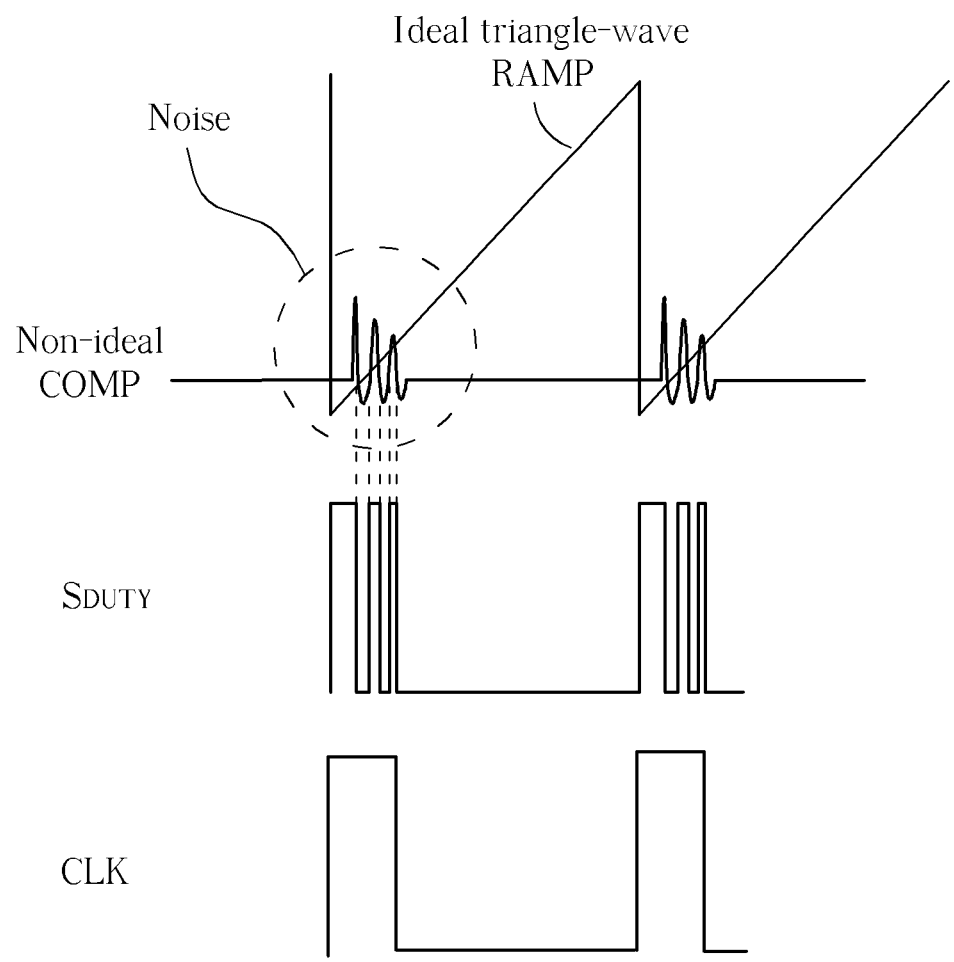
FIG. 4 is a schematic diagram of waveforms of the ideal triangle-wave signal RAMP, the comparison signal influenced by the noise, the duty cycle signal and the clock signal shown in FIG. 2.
Figure 5:
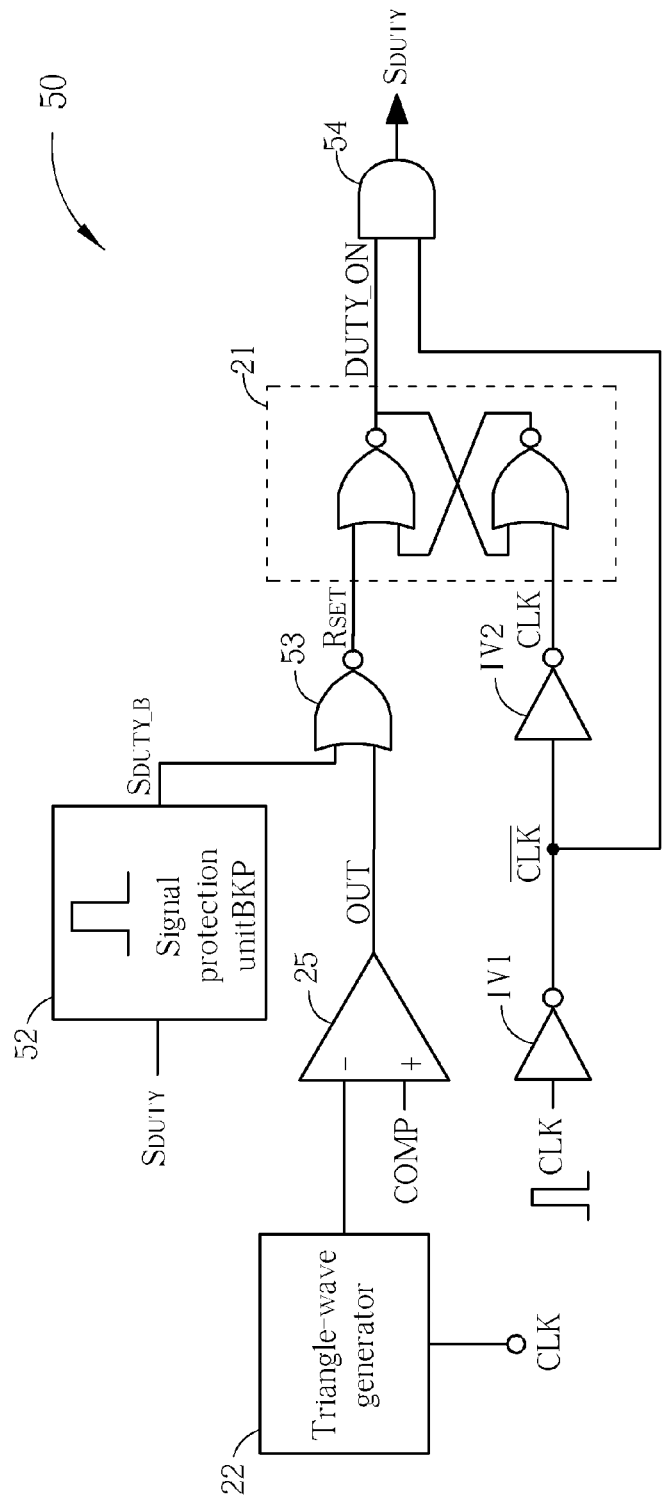
FIG. 5 is a schematic diagram of a duty cycle generator according to an embodiment of the present invention.

Please refer to FIG. 5, which is a schematic diagram of a duty cycle generator 50 according to an embodiment of the present invention. The duty cycle generator 50 may be substituted for the duty cycle generator 14 of the power converter 10. The power converter 10 is preferably a voltage mode power converter. The duty cycle generator 50 includes inverters IV1 and IV2, an SR-latch 21, a triangle-wave generator 22, a signal protection unit 52, a NOR gate 53, an AND gate 54 and a comparator 25. As shown in FIG. 5, a positive input terminal of the comparator 25 is coupled to the comparison signal COMP of the power converter 10, a negative input terminal of the comparator 25 is coupled to the triangle-wave generator 22 to receive the triangle-wave signal RAMP. The comparator 25 is used for comparing the triangle-wave signal RAMP with the comparison signal COMP to generate a comparison result OUT. The signal protection unit 52 is used for receiving the duty cycle signal $S_{DUTY}$ and the signal protection unit 52 may generate a break pulse BKP to keep the duty cycle signal $S_{DUTY}$ at a high voltage within a duration of the break pulse BKP to generate a protected duty cycle signal $S_{DUTY\_B}$. An input terminal of the NOR gate 53 is coupled to the comparison result OUT and the protected duty cycle signal $S_{DUTY\_B}$ for generating a reset signal $R_{SET}$ according to the comparison result OUT and the protected duty cycle signal $S_{DUTY\_B}$. A reset input terminal of the SR-latch 21 is coupled to the reset signal $R_{SET}$, a set input terminal of the SR-latch 21 is coupled to an output terminal of the inverter IV2 for outputting a turn-on signal DUTY_ON according to the clock signal CLK and the reset signal $R_{SET}$. The AND gate 54 is coupled to an output terminal of the inverter IV1 and an input terminal of the inverter IV2 for generating the duty cycle signal $S_{DUTY}$ according to the inverted clock signal $\overline{CLK}$ and the turn-on signal DUTY_ON.

In operation, when the clock signal CLK is at a high voltage and the comparison signal COMP is greater than the triangle-wave signal RAMP, the set input terminal of the SR-latch 21 is at a high voltage and the comparison result OUT is at a high voltage. The NOR gate 53 may accordingly transfer the comparison result OUT into a low voltage, and thus the reset input terminal of the SR-latch 21 is at a low voltage, such that the SR-latch 21 may output the turn-on signal DUTY_ON at a high voltage. Meanwhile, the inverted clock signal $\overline{CLK}$ is at a low voltage, and the AND gate 54 may generate the duty cycle signal $S_{DUTY}$ at a low voltage according to the turn-on signal DUTY_ON and the inverted clock signal $\overline{CLK}$. Until the clock signal CLK is turned to a low voltage and the inverted clock signal $\overline{CLK}$ is turned to a high voltage, a logic voltage of the duty cycle signal $S_{DUTY}$ is mainly controlled by the turn-on signal DUTY_ON, such that the AND gate 54 may output the duty cycle signal $S_{DUTY}$ at a high voltage. As a result, the duty cycle generator 50 may ensure the duty cycle signal $S_{DUTY}$ is at a low voltage within a duration of the clock signal CLK, which avoids a ripple waveform of the triangle-wave signal RAMP in the early rising edge. When the clock signal CLK is turned to at a low voltage, the AND gate 54 may output the duty cycle signal $S_{DUTY}$ at a high voltage, so as to generate the stable duty cycle signal $S_{DUTY}$.

Then, the duty cycle signal $S_{DUTY}$ at a high voltage may be transferred into the front-end drive signal UG by the front-end driver 15 to turn on the high-side switch HS to generate the output voltage $V_{OUT}$. The output voltage $V_{OUT}$ is transferred into the feedback voltage FB by the adjustment unit AD, and the comparator OPA may compare the feedback voltage FB with the reference voltage REF to generate the comparison signal COMP. The compensation circuit 18 disposed outside the power converter 10 is susceptible to the noise from outer elements or circuits, which may cause the comparison signal COMP to be influenced by the noise. To avoid the above situation, the signal protection unit 52 may generate the protected duty cycle signal $S_{DUTY\_B}$ via generating the break pulse BKP to keep the duty cycle signal $S_{DUTY}$ at a high voltage within a duration of the break pulse BKP. As a result, although the comparison signal COMP is influenced by the noise and the comparator 25 outputs the swinging comparison result OUT, the signal protection unit 52 may still keep the duty cycle signal $S_{DUTY}$ at a high voltage within the duration of the break pulse BKP, which avoids the SR-latch 21 outputting the swinging duty cycle signal $S_{DUTY}$ to the power converter 10 and achieves signal protection. Noticeably, a pulse width $W_{BKP}$ of the break pulse BKP may be adjusted according to practical requirements, as long as the pulse width $W_{BKP}$ of the break pulse BKP is less than a pulse width $W_D$.

Figure 6:
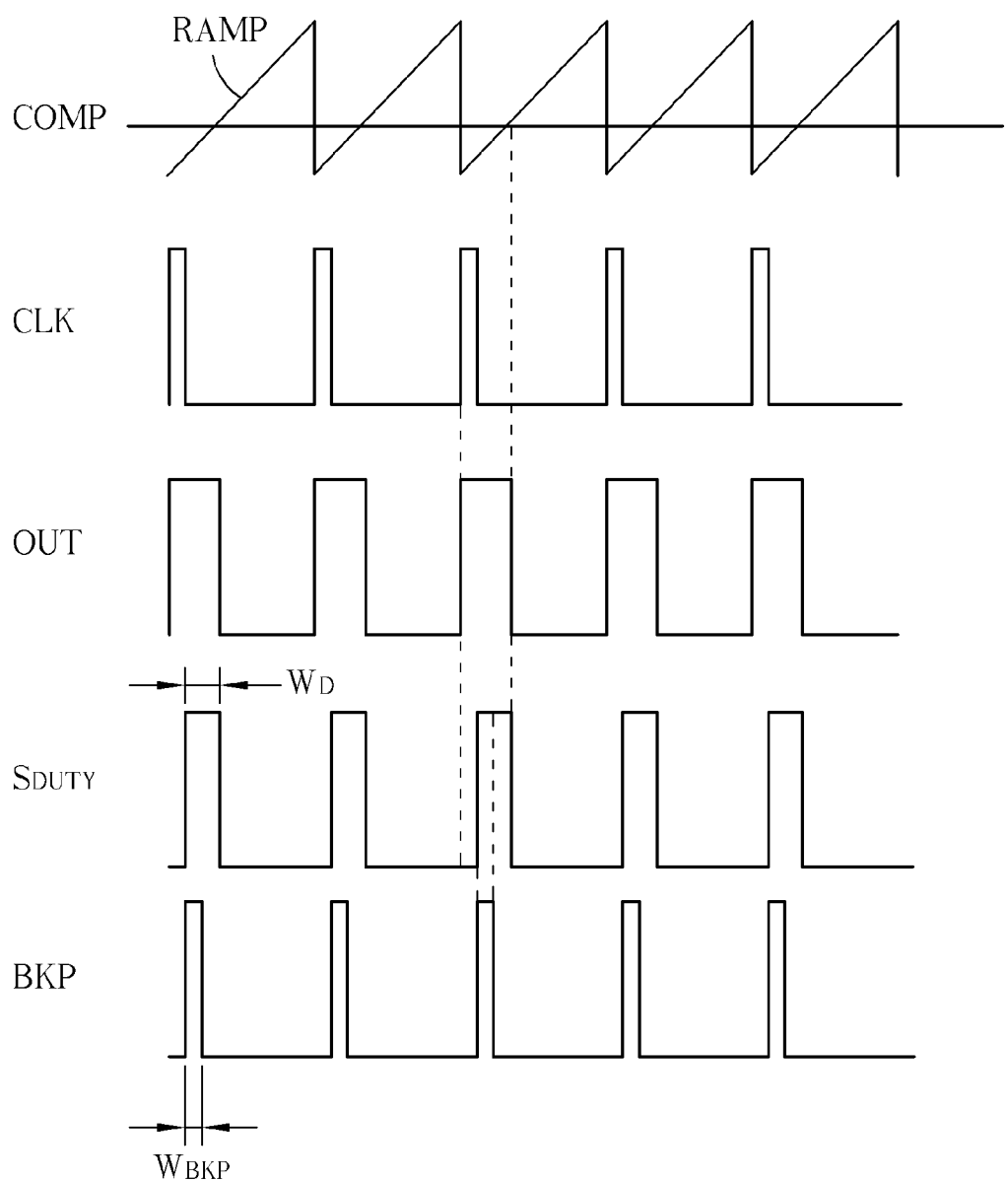
FIG. 6, which is a schematic diagram of waveforms of the triangle-wave signal, the comparison signal, the clock signal, the comparison result, duty cycle signal, and the break pulse BKP shown in FIG. 5.

Please refer to FIG. 6, which is a schematic diagram illustrating waveforms of the triangle-wave signal RAMP, the comparison signal COMP, the clock signal CLK, the comparison result OUT, duty cycle signal $S_{DUTY}$, and the break pulse BKP of the duty cycle generator 50. As shown in FIG. 6, when the clock signal CLK rises at a high voltage, the triangle-wave signal RAMP starts increasing from zero voltage and the comparison signal COMP is greater than triangle-wave signal RAMP, the comparator 21 may output the comparison result OUT at a high voltage. The inverted clock signal $\overline{CLK}$ at a low voltage may control the AND gate 54 to output the duty cycle signal $S_{DUTY}$ at a low voltage, which avoids the non-ideal transient state during the rising edge of the clock signal CLK.

Then, when the clock signal CLK falls to a low voltage and the comparison signal COMP is still greater than triangle-wave signal RAMP, the comparator 21 keeps outputting the comparison result OUT at a high voltage. No matter the comparator 21 outputs the swinging comparison result OUT due to the noisy comparison signal COMP, the protected duty cycle signal $S_{DUTY\_B}$ is generated by the signal protection unit 52 to output to the NOR gate 53, such that the protected duty cycle signal $S_{DUTY\_B}$ is at a high voltage within the duration of the break pulse BKP. Until the comparison signal COMP is greater than triangle-wave signal RAMP, the duty cycle signal $S_{DUTY}$ falls to a low voltage.

In short, within the duration of the clock signal CLK, the inverted clock signal $\overline{CLK}$ may control the AND gate 54 to output the duty cycle signal $S_{DUTY}$ at a low voltage, which avoids the non-ideal transient state during the rising edge of the clock signal CLK. On the other hand, when the clock signal CLK falls to a low voltage, within the duration of the break pulse BKP, the duty cycle signal $S_{DUTY}$ is kept at a high voltage to avoid the comparison signal COMP being influenced by the noise causing the duty cycle generator 50 to generate the swinging duty cycle signal $S_{DUTY}$, so as to achieve signal protection.

To sum up, the traditional duty cycle generator may generate the swinging duty cycle signal $S_{DUTY}$ due to inner parasitic elements or the noise from outer elements, which may cause the power converter to generate the wrong output voltage $V_{OUT}$ when the duty cycle is relative low. In comparison, the duty cycle generator of the present invention may keep the duty cycle signal at a low voltage within the duration of the clock signal, and utilize the signal protection unit to keep the duty cycle signal at a high voltage, and thus achieves signal protection and better susceptibility.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A duty cycle generator for generating a duty cycle signal to a power converter, comprising:
   a first inverter coupled to a clock signal for inverting the clock signal;
   a second inverter cascaded to the first inverter for outputting the clock signal;
   a signal protection unit including an input terminal coupled to the duty cycle signal for generating a break pulse to generate a protected duty cycle signal;
   a comparator including a positive input terminal coupled to a comparison signal of the power converter and a negative input terminal coupled to a triangle-wave signal for comparing the triangle-wave signal with the comparison signal to generate a comparison result;
   a NOR gate including a first input terminal coupled to the comparison result, and a second input terminal coupled to an output terminal of the signal protection unit for generating a reset signal according to the comparison result and the protected duty cycle signal;

an SR-latch including a set input terminal coupled to an output terminal of the second inverter, a reset input terminal coupled to an output terminal of the NOR gate, and an output terminal for outputting a turn-on signal according to the clock signal and the reset signal; and an AND gate including a first input terminal coupled to the output terminal of the SR-latch, and a second input terminal coupled to the output terminal of the first inverter and the input terminal of the second inverter for generating the duty cycle signal according to the inverted clock signal and the turn-on signal.

2. The duty cycle generator of claim 1, further comprising a triangle-wave generator for generating the triangle-wave signal.

3. The duty cycle generator of claim 1, wherein when the comparison signal is greater than the triangle-wave signal and the clock signal is at a high voltage, the duty cycle signal outputted by the AND gate is at a low voltage.

4. The duty cycle generator of claim 3, wherein when the comparison signal is greater than the triangle-wave signal and the clock signal is at a low voltage, the duty cycle signal outputted by the AND gate is at a high voltage.

5. The duty cycle generator of claim 4, wherein when the comparison signal is greater than the triangle-wave signal and the clock signal is at a low voltage, the break pulse is at a high voltage.

6. The duty cycle generator of claim 1, wherein a pulse width of the break pulse is less than a pulse width of the duty cycle signal.

7. The duty cycle generator of claim 1, wherein the power converter is a voltage mode power converter.

8. A power converter for converting an input voltage to an output voltage, comprising:
  a duty cycle generator for generating a duty cycle signal, comprising:
    a first inverter coupled to a clock signal for inverting the clock signal;
    a second inverter cascaded to the first inverter for outputting the clock signal;
    a signal protection unit including an input terminal coupled to the duty cycle signal for generating a break pulse to generate a protected duty cycle signal;
    a comparator including a positive input terminal coupled to a comparison signal of the power converter and a negative input terminal coupled to a triangle-wave signal for comparing the triangle-wave signal with the comparison signal to generate a comparison result;
    a NOR gate including a first input terminal coupled to the comparison result, and a second input terminal coupled to an output terminal of the signal protection unit for generating a reset signal according to the comparison result and the protected duty cycle signal;
    an SR-latch including a set input terminal coupled to an output terminal of the second inverter, a reset input terminal coupled to an output terminal of the NOR gate, and an output terminal for outputting a turn-on signal according to the clock signal and the reset signal; and
    an AND gate including a first input terminal coupled to the output terminal of the SR-latch, and a second input terminal coupled to the output terminal of the first inverter and the input terminal of the second inverter for generating the duty cycle signal according to the inverted clock signal and the turn-on signal;
  a drive stage circuit coupled to an output terminal of the duty cycle generator for outputting a switch signal according to the duty cycle signal;
  an output stage circuit coupled to an output terminal of the drive stage circuit for generating the output voltage according to the switch signal; and
  a feedback circuit coupled between the output stage circuit and the duty cycle generator for outputting the comparison signal to the duty cycle generator according to the output voltage.

9. The power converter of claim 8, further comprising a clock generator coupled to the duty cycle generator for generating the clock signal to the duty cycle generator.

10. The power converter of claim 8, wherein the drive stage circuit comprises:
  a first front-end driver including an input terminal coupled to the duty cycle signal, and an output terminal for generating a first front-end drive signal according to the duty cycle signal;
  a high-side switch including a drain coupled to the input voltage, a gate coupled to the output terminal of the first front-end driver, and a source for turning on or off the high-side switch according to the first front-end drive signal to generate the high-side switch turn-on signal;
  a second front-end driver including an input terminal coupled to the duty cycle signal, and an output terminal for generating a second front-end drive signal according to the duty cycle signal; and
  a low-side switch including a drain coupled to the input voltage, a gate coupled to the output terminal of the second front-end driver, and a source for turning on or off the low-side switch according to the second front-end drive signal.

11. The power converter of claim 8, wherein the output stage circuit comprises:
  an inductor coupled to an output terminal of the drive stage circuit for generating the output voltage; and
  an output capacitor coupled between the output terminal of the drive stage circuit and a ground.

12. The power converter of claim 8, wherein the feedback circuit comprises:
  an adjustment unit coupled to the inductor and the output capacitor for transferring the output voltage to a feedback voltage; and
  a comparator including a positive input terminal coupled to a reference signal, a negative input terminal coupled to the feedback voltage for comparing the feedback voltage with the reference signal to generate the comparison signal.

13. The power converter of claim 8, further comprising a compensation circuit coupled between the duty cycle generator and the feedback circuit, the compensation circuit comprising:
  a resistor coupled to the feedback voltage;
  a first capacitor coupled between the resistor and the comparison signal; and
  a second capacitor coupled between the feedback voltage and the comparison signal.

14. The power converter of claim 8, further comprising a triangle-wave generator for generating the triangle-wave signal.

15. The power converter of claim 8, wherein when the comparison signal is greater than the triangle-wave signal and the clock signal is at a high voltage, the duty cycle signal outputted by the AND gate is at a low voltage.

16. The power converter of claim 15, wherein when the comparison signal is greater than the triangle-wave signal and the clock signal is at a low voltage, the duty cycle signal outputted by the AND gate is at a high voltage.

17. The power converter of claim 16, wherein when the comparison signal is greater than the triangle-wave signal and the clock signal is at a low voltage, the break pulse is at a high voltage.

18. The power converter of claim 8, wherein a pulse width of the break pulse is less than a pulse width of the duty cycle signal.

19. The power converter of claim 8, wherein the power converter is a voltage mode power converter.

* * * * *